United States Patent
Kawabata et al.

(10) Patent No.: US 7,415,568 B2
(45) Date of Patent: Aug. 19, 2008

(54) METHOD AND APPARATUS FOR INITIALIZATION CONTROL IN A NON-VOLATILE MEMORY DEVICE

(75) Inventors: Shozo Kawabata, Inuyama (JP); Takaaki Furuyama, Kani (JP); Kenta Kato, Seto (JP)

(73) Assignee: Spansion LLC, Sunnyvale, CA (US)

( * ) Notice: Subject to any disclaimer, the term of this patent is extended or adjusted under 35 U.S.C. 154(b) by 300 days.

(21) Appl. No.: 11/194,111

(22) Filed: Jul. 28, 2005

(65) Prior Publication Data

US 2006/0023500 A1 Feb. 2, 2006

Related U.S. Application Data

(63) Continuation of application No. PCT/JP2004/010837, filed on Jul. 29, 2004.

(51) Int. Cl.
G11C 16/02 (2006.01)

(52) U.S. Cl. ...................... 711/103; 711/150; 365/185.2

(58) Field of Classification Search .................. 701/100, 701/103, 150, 173; 365/185.33, 230.03, 365/185.2; 711/103, 150
See application file for complete search history.

(56) References Cited

U.S. PATENT DOCUMENTS

| | | | |
|---|---|---|---|
| 6,292,392 B1 | 9/2001 | Fukui | |
| 2003/0112652 A1 | 6/2003 | Tanzawa et al. | |
| 2003/0142545 A1 | 7/2003 | Imamiya et al. | |
| 2005/0219907 A1* | 10/2005 | Roohparvar | 365/185.22 |
| 2006/0050593 A1* | 3/2006 | Toyama et al. | 365/230.03 |
| 2007/0067581 A1* | 3/2007 | Baek | 711/153 |

FOREIGN PATENT DOCUMENTS

| JP | 60-205428 | 10/1985 |
|---|---|---|
| JP | 09-055084 | 2/1997 |
| JP | 09-326679 | 12/1997 |
| JP | 2000-066760 | 3/2000 |
| JP | 2001-1796290 | 6/2001 |

* cited by examiner

*Primary Examiner*—Donald Sparks
*Assistant Examiner*—Jared I Rutz
(74) *Attorney, Agent, or Firm*—Ingrassia Fisher & Lorenz, P.C.

(57) ABSTRACT

When an initializing operation starts, a busy state indicative of the disenable of access operation is set (S11), and read operation information is read out by preferentially using a verify sense amplifier 4 or a high-speed read sense amplifier 3 (S12). Upon completion of latching the read operation information (S13: Y), a ready state that announces that the read access operation from a non-redundant memory region is enabled is set (S14), and a ready signal is outputted according to an external read access request to the non-redundant memory region. A boot program or the like which is in the non-redundant memory region can be read out in parallel with the read of the operation information. Subsequently, the redundancy information is read out (S15), and a ready state that announces that the read access operation from all of the memory regions is enabled is set upon completion of reading out the redundancy information (S17). Thereafter, rewrite operation information is read out (S18). The period of time since the start of the initializing operation to the start of the read access operation can thereby be reduced.

12 Claims, 11 Drawing Sheets

READ ACCESS OPERATION (NORMAL OPERATION)

METHOD AND APPARATUS FOR INITIALIZATION CONTROL IN A NON-VOLATILE MEMORY DEVICE

CROSS-REFERENCES TO RELATED APPLICATIONS

This is a continuation of International Application No. PCT/JP2004/010837, filed Jul. 29, 2004 which was not published in English under PCT Article 21(2).

TECHNICAL FIELD

The present invention relates to setting operation information in a non-volatile memory device, and more particularly to an initialization operation performed at the time of power-up by a power supply or preformed at the time of resetting.

BACKGROUND

1. Background Art

In the non-volatile memory device disclosed in paragraphs [0009] of [0021] of Japanese Kokai Publication No. JP 2001-176290 (Patent Document 1), at the time of power-up by a power supply, initial setting data in an initial setting data region provided within a memory cell array is latched in a data latch circuit. Specifically, as shown in FIG. 11, upon detection of power-on, power-on-reset is effected (S110), and a ready/busy signal (R/B) is set to a busy state (S130) after a predetermined waiting time (S120). Then, defective address data, control voltage value data and other initial setting data are read and set (S140 to S160). Upon completion of reading out all of initial setting data, R/B is set to a ready state (standby state) (S170). The busy state of R/B allows external notification of access inhibition.

The initial setting operation from the detection of power-on to latching initial setting data in the data latch circuit is programmed in a control circuit that controls the writing and erasing operation in advance so that the initial setting operation is automatically controlled in response to the power-on. Upon starting the control circuit, the initial setting data is read out from a decode circuit and a sense amplifier circuit as with regular data readout.

Also, paragraphs [0008] to [0010] of Japanese Kokai Publication No. JP 2003-178589 (Patent Document 2) disclose operations similar to Patent Document 1. It is assumed that the initial setting data is read, in addition to the operation of Patent Document 1, on the basis of an internal clock that is generated in the interior of the chip. When the internal clock is not adjusted by trimming data for canceling process variations, a variation in the cycle becomes large. In the case where the cycle is varied toward a long cycle side, a waiting time is lengthened. In view of this problem, clock cycle adjustment data for adjusting a clock cycle that is generated by a clock generator circuit is first read out among the initial setting data after power-up. Then, the clock cycle generated by the clock generator circuit is adjusted. After completion of this adjustment, remaining initial setting data is read out. That is, Patent Document 2 discloses that the remaining initial setting data is read out on the basis of an operation clock that is adjusted on the basis of the clock cycle adjustment data. Patent Document 1, as well as Patent Document 2, provides external notification of the access inhibition according to the busy state of R/B until after reading out and setting defective address data S6, control voltage value data S7 and other initial setting data S8.

Finally, Japanese Kokai Publication No. JP S60-205428 (Patent Document 3) provides additional relevant prior art disclosures.

2. Problems to Be Solved by the Invention

In Patent Documents 1 and 2, the busy state of the ready/busy signal R/B which inhibits external access is outputted until all of the initial setting data is latched in the data latch circuit when the power turns on, thereby preventing improper external access if initial setting is not completed.

However, the initial setting data of a non-volatile memory device includes, for example, setting information of circuit constants for various operations, as well as setting information of redundant addresses that relieves defective memory cell issues, and setting information for a write protect function such as information on whether writing in a given memory region which is represented by a sector is permissible or not. The number of the initial setting data will increase for larger capacities of non-volatile memory devices. This means that the required time for reading out the initial setting data from the initial setting data region and latching the initial setting data in the data latch circuit at the time of power-up will increase. Also, for storing larger amounts of initial setting data, it is expedient that one area of a memory cell array that is a region in which regular data is stored is allocated as an initial setting data area.

Regular access operation cannot be utilized on the memory array while the initial setting data is read out from the initial setting data area that is disposed in one area of the memory cell array, and the busy state will be maintained for longer periods of time as the initial setting data increases. As a result, there arises a problem that a great period of time may be required for initial setting at the time of power-up.

In particular, in the case where the non-volatile memory device is incorporated into a system, and boot programs or application programs at the time of starting the system are stored therein, there arises a problem that the period of time required for the boot program to start after the power-up, or until the application program starts after the power-up, may be long.

SUMMARY OF THE INVENTION

Means for Solving the Problem

The present invention solves at least one of the problems of the above background art, and therefore an object of the present invention is to enable the read access operation with respect to the non-volatile memory device for a short period of time from start of the initializing operation by appropriately controlling the initializing operation and the external access operation, and efficiently reading the operation information in the initializing operation of the nonvolatile memory device at the time of power-up or resetting.

An initialization control method of a non-volatile memory device according to the present invention which has been made to achieve the above object is characterized in that when operation information is read out from a memory cell array during an initialization operation, the reading operation information is read out preferentially among the operation information.

In the initialization control method of the non-volatile memory device according to the present invention, the operation information for reading various operation conditions of the non-volatile memory device is stored in the memory cell array, and the operation conditions are read from the memory cell array during the initializing operation. As a result, the read operation information is read in preference to the various other operation information.

As a result, since the read operation information is read in preference to other operations, the read conditions are set in the non-volatile memory device in preference thereto, and the operation conditions that enable the read access operation to be conducted at an initial stage of the initializing operation are set. The amount of operation information increases as capacity of the non-volatile memory device increases, and, even in the case where such operation information is stored in an area of the memory cell array in which the regular data is stored, the read access operation from the non-volatile memory device can be conducted at the initial stage of the initializing operation without waiting for reading all of the operation information. After the read access operation has been enabled, the regular data read operation including the boot program and the application program can be conducted in parallel with reading the operation information. Also, it is possible to start the read access operation externally, including starting operation of the respective programs from the initial stage of the initializing operation.

Also, according to a first aspect of the present invention, there is provided a non-volatile memory device with a memory cell array in which operation information to be set during an initialization operation is stored, the non-volatile memory device comprising a first memory region in which the operation information is stored and a second memory region apart from the first memory region to which access control is applied.

In the non-volatile memory device according to the first aspect of the present invention, the operation information for setting various operation conditions of the non-volatile memory device is stored in a first memory region of the memory cell array, and the read access operation is conducted in a region of the memory cell array separate from the first memory region and is conducted independently of any read access operation in the first memory region.

As a result, since the access control of the first memory region and the second memory region are conducted independently from each other, normal read access operation can be conducted in the second memory region while the operation information is read out from the first memory region. The amount of operation information increases with increased capacity of the non-volatile memory device, and, even in the case where the operation information is stored in an area of the memory cell array in which the regular data is stored, the read access operation from the non-volatile memory device can be conducted in parallel with reading of the operation information in the initializing operation without waiting for reading all of the operation information. The regular data read operation including reading the boot program and the application program can be conducted from the second memory region while conducting the read operation of the operation information from the first memory region.

Also, according to a second aspect of the present invention, there is provided a non-volatile memory device comprising a read amplifier(s) for reading information from the memory cell array during a read access operation, wherein read-operation information to be read preferentially out of the operation information during the initialization operation is read by the read amplifier(s), and the operation information to be read after the read-operation information is read by a verify amplifier(s).

According to the second aspect of the present invention, there is provided a non-volatile memory device in which the operation information is read during the initializing operation using a verify amplifier for verifying a rewrite state during a regular rewrite access operation.

As a result, since the verify amplifier is different from an amplifier used in the regular read access operation and is used at the time of reading the operation information which is conducted at the time of the initializing operation, the read access operation can be conducted in parallel with reading the operation information by the verify amplifier.

Also, according to a third aspect of the present invention, there is provided a non-volatile memory device with a memory cell array in which operation information to be set during an initialization operation is stored, the non-volatile memory device comprising an auto-rewrite control circuit for controlling a write access operation, and a read amplifier(s) for reading information from the memory cell array during a read access operation, wherein the auto-rewrite control circuit conducts read control of the operation information during the initialization operation and activates the read amplifier(s) concurrently.

In the non-volatile memory device according to the third aspect of the present invention, the automatic rewrite control circuit that controls the rewrite access operation conducts the read control of the operation information and also activates the read amplifier during the initializing operation. The operation information from the memory cell array is then read by the read amplifier.

As a result, in the case of reading the operation information by using the automatic rewrite control circuit in the initializing operation, a large number of read amplifiers provided in correspondence with the continuous read access operation can be used without being limited to the amplifier (verify amplifier) that conducts verification of the rewrite state, thereby allowing a large amount of operation information to be read at one time.

Effects of the Invention

According to the present invention, since the read operation information is read from the operation information in preference to reading the operation information at the time the initializing operation is conducted at the time of power-up or resetting, and the amplifiers are used for the read operation of the operation information and the read access operation and, respectively, the initializing operation and the external access operation are appropriately controlled. Also, the read operation of the operation information is efficiently conducted, and the read access operation with respect to the non-volatile memory device can advantageously be conducted early.

DETAILED DESCRIPTION OF THE INVENTION

Hereinafter, embodiments that execute an initialization control method of a non-volatile memory device and a non-volatile memory device according to the present invention will be described in detail with reference to FIGS. 1 to 10.

Figure 1:
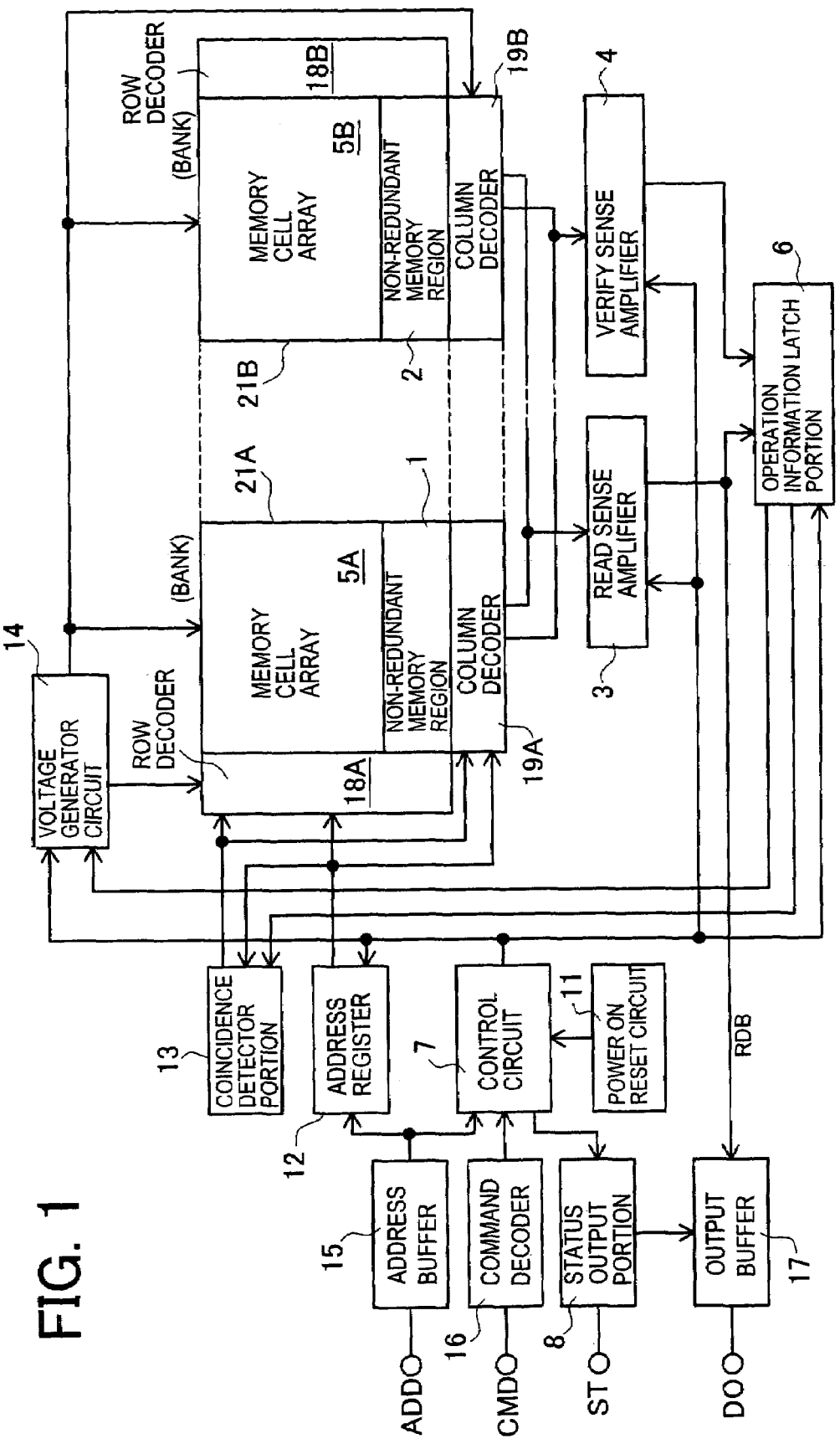
FIG. 1 is a circuit block diagram showing a non-volatile memory device in accordance with embodiments of the present invention.

FIG. 1 is a circuit block diagram that depicts a non-volatile memory device according to first and second embodiments of the present invention, as will be described later. In the non-volatile memory device shown in FIG. 1, a plurality of banks 21A and 21B that can be accessed (nonexclusively) are disposed in each of the memory cell array regions 5A and 5B, independently. Each of the memory cell array regions 5A and 5B is made up of memory arrays of small blocks which are called "large sectors" or "small sectors" of an arbitrary non-volatile memory cell number which are minimum units of erase. In this example, the small sector and the large sector are different in the memory element capacity within one sector, and the arbitrary number of non-volatile memory cells in the large sector is larger than that in the small sector. In addition, there are redundant sectors (not shown) for relieving the defective large sector or small sector. Also, a column redundant memory cell that conducts redundant relief in bit line units is disposed within each of the large sector, the smaller sector and the redundant sector. Also, the respective banks 21A and 21B are provided with non-redundant memory regions 1 and 2 having no redundant relief structure. A boot sector that is made up of arbitrary non-volatile memory cell number exists in each of the non-redundant memory regions 1 and 2. In general, the boot sector stores a boot program for system start therein, an application program(s) is stored in the small sector, and general data such as moving pictures or sound information is stored in the large sector.

The access operation to those memory regions is conducted by decoding a command signal that is inputted from a command terminal CMD in a command decoder 16. The command signal that has been decoded in the command decoder 16 is transmitted to a control circuit 7. The control circuit 7 controls an address register 12, a voltage generator circuit 14, a read sense amplifier 3, a verify sense amplifier 4 and an operation information latch portion 6 that is a volatile memory portion that stores the operation information in response to the command signal. The circuit type of the operation information latch portion 6 may be a general register type or an inverter latch type. In this example, the voltage generator circuit 14 supplies a bias voltage required for read/rewrite access operation to row decoders 18A and 18B, column decoders 19A and 19B, and the memory regions. The read sense amplifier 3 is connected to an output buffer 17 and outputs data of the non-volatile memory to an output terminal D0 which is an external I/O terminal. The verify sense amplifier 4 is a sense amplifier for verification which is used at the time of rewriting the non-volatile memory (program or erase) which will be described later, and the verify sense amplifier 4 is not connected to the external I/O terminal.

Also, an address signal that is inputted to the address register 12 through an address buffer 15 from an address terminal ADD is subjected to redundant relief judgment in a coincidence detector portion 13 if required. Then, the addresses within the memory region are selected by the row decoders 18A and 18B, and the column decoders 19A and 19B. With respect to the command signal indicative of the read access operation, information that is read from the column decoders is amplified by the read sense amplifier 3 according to an inputted address signal, and then outputted to an output terminal D0 from the output buffer 17 through a read data line RDB.

In the non-volatile memory device, the read operation information such as operation timing information of various circuits or setting information of a bias voltage value which is required at the time of conducting the read access operation, the redundancy information such as a row address or a column address which conduct redundant relief, and the rewrite operation information such as setting information of a bias voltage value or write protect information which is required at the time of conducting the rewrite access operation are all stored in, for example, the non-redundant memory region within the memory region in advance. Such information is required to be read out and set in the operation information latch portion 6 at the time of conducting the initializing operation with power-on or reset input. In order to conduct the read/rewrite access operation or the redundant relief, the operation information is required. Therefore, if this stored information is read from the memory region each time, there is a fear that the access operation may be late and a fear that the memory region may not operate normally as a result of competition that access operations produce between the reading operation and the regular access operation.

Also, the amount of the operation information to be set in advance increases with an increase in capacity of the non-volatile memory device, and an increase in the occupied area becomes considerable in the case where a dedicated memory region is provided in addition to the regular memory region. In order to solve this problem, there is generally known a control structure in which one area of the regular memory region is allocated for operation information, and the operation information is stored in the reserved area in advance. In this conventional structure, the stored operation information is read out in the operation information latch portion 6 according to the initializing operation.

A control signal from the power-on-reset circuit 11 that detects power-on and a reset signal not shown are inputted to the control circuit 7. The control circuit 7 controls the read sense amplifier 3 and the verify sense amplifier 4, and reads out the operation information that has been stored in the non-redundant memory region 1 and/or the non-redundant memory region 2. Also, the control circuit 7 controls the operation information latch portion 6 for latching the operation information that is read out of the sense amplifiers 3 and 4. In addition, the control circuit 7 reads various operation information out of the operation information latch portion 6 at a given timing that will be described later, and controls the voltage generator circuit 14 and the coincidence detector 13.

Also, in the case where the command for a read/rewrite access operation for a predetermined address is inputted from an external source, the command signal from the command decoder 16, and also the address signal from the address buffer 15 in response to the command signal are inputted to the control circuit 7. In the case where the initializing operation is being executed, the control circuit 7 outputs a status signal indicative of whether the access operation is enabled or not according to the kind of the command signal to be inputted and the address signal to be accessed. The status signal is outputted to a status terminal ST through the status output portion 8.

In this example, the status terminal ST can be structured by providing a dedicated terminal, or by using a data terminal DQx not shown (x is, for example, 0 to 2) in FIG. 3 as will be described later. In this example, the data terminal DQx is directed to a data output terminal, or a data input/output terminal that is an external I/O terminal. In FIG. 1, the data terminal DQx is, for example, the output terminal D0.

The operation information that is read out in the initializing operation is stored in one area of the memory region. It is preferable that the operation information is stored in the non-volatile memory regions 1 and/or 2 where no redundant relief is conducted among the memory regions. The redundancy information such as information on the address to be subjected to redundant relief is stored in the operation information, and the memory cell to be subjected to redundant relief in the coincidence detector portion 13 is decided only after the redundancy information has been latched in the operation information latch. For that reason, the access operation to the memory cell array regions 5A and 5B that enable redundant relief cannot be executed at the read state of the operation information until the redundancy information is latched.

As will be described later, it is preferable to read out the read operation information for setting the read conditions in preference to the reading order of the operation information. As a result, because the operation conditions for conducting the read access operation can be set, even if the initializing operation for reading out other operation information is continued, the read access operation from the non-redundant memory regions 1 and/or 2 can be conducted. When the boot program, i.e., a program for starting the system, is stored in the non-redundant memory regions 1 and/or 2, the regular read access operation is executed in parallel with the initializing operation thereby making it possible to read out the boot program. The system can start, and the start up time of system after power-on and/or reset can be reduced.

In this case, the operation information and the boot program are stored in the non-redundant memory regions 1 and 2 which are in different banks 21A and 21B, respectively, and control is performed such that the operation information is read out by the verify sense amplifier 4 and the boot program is read out by the read sense amplifier 3, thereby making it possible to conduct the read of the initializing operation and the read access operation of the boot program in parallel. In this example, FIG. 1 shows a structure having a set of read sense amplifiers 3 and a set of verify sense amplifiers 4 commonly to the respective banks. However, the requirements for implementing the present invention are not limited to this structure; instead a set of read sense amplifiers 3 and a set of verify sense amplifiers 4 may be provided for each of the banks.

Figure 2:
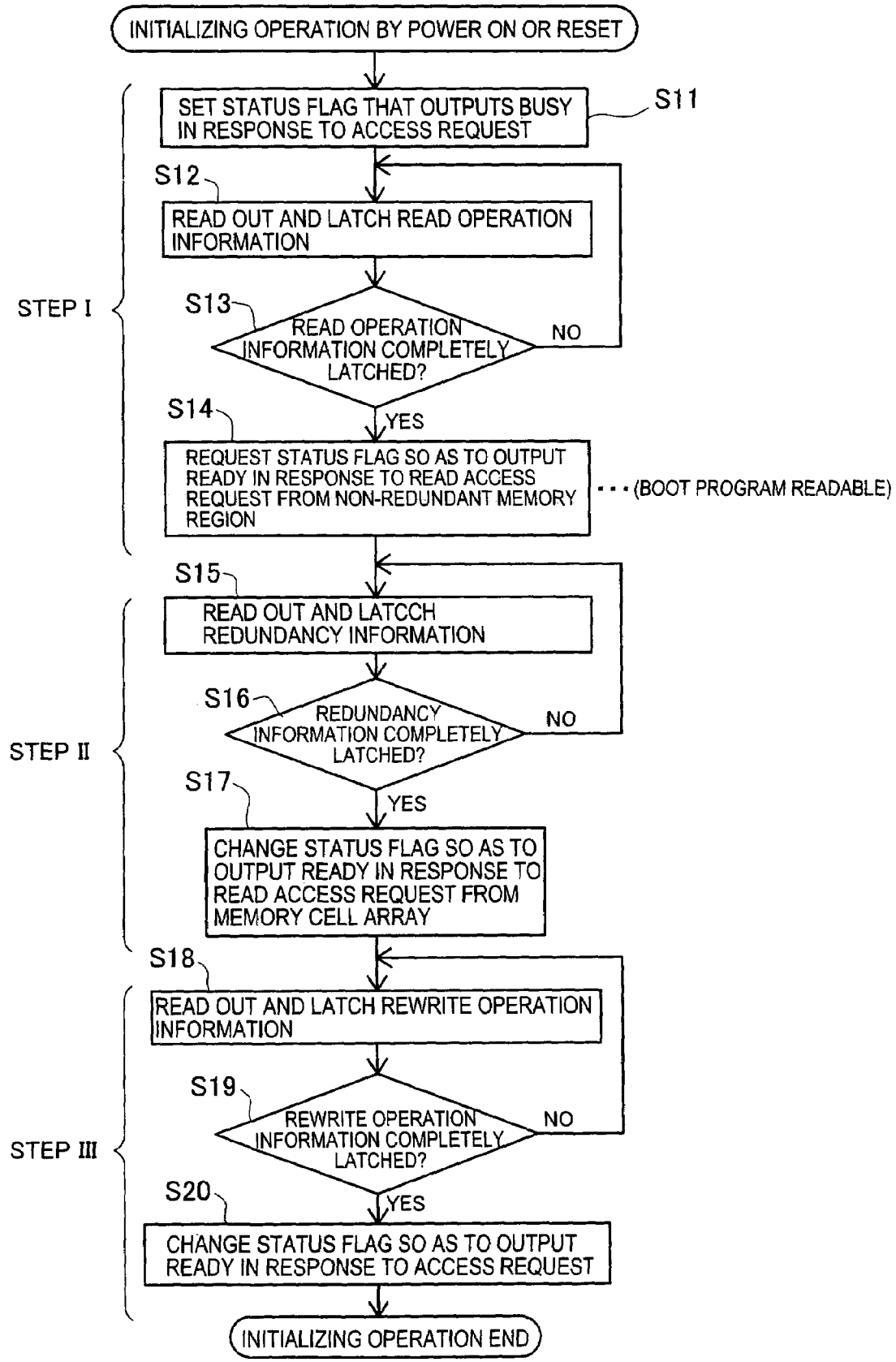
FIG. 2 is a flowchart showing the initializing operation in accordance with a first embodiment of the present invention.

FIG. 2 is a flowchart showing operation of the circuit of FIG. 1 in accordance with a first embodiment of the present operation. The first embodiment will be described with reference to the circuit block diagram shown in FIG. 1. Upon inputting the power-on or the reset command, the non-volatile memory device starts the initializing operation. First, in response to the access request by the command signal from the command terminal CMD, the control circuit 7 sets a status flag indicative of a busy state in which the access operation is impossible (S11), and outputs a busy signal through the status output portion 8 according to an external access request since the latch of the operation information has not been completed with the start of the initializing operation.

The control circuit 7 starts the latch control of the initializing operation. In this case, the read operation information for setting the read condition is preferentially read out (S12). More specifically, the control circuit 7 operates the address register 12, and an address signal indicative of a position of an address space in which the read operation information is stored among the operation information is outputted from the address register 12. Also, the control circuit 7 activates the read sense amplifier 3 and/or the verify sense amplifier 4 to read out the read information.

The verify sense amplifier 4 can be used for reading out the read operation information. In addition, since an external access request is inhibited, the read sense amplifier 3 can be used. In general, in comparison with the verify sense amplifier 4 used for the rewrite operation, the read sense amplifier 3 used for the read access operation can conduct the read operation at a high speed, and a large number of read sense amplifiers 3 are disposed in response to the burst operation. Accordingly, at the stage of reading out the read operation information in the initializing operation, the read sense amplifier 3 is activated instead of the verify sense amplifier 4 or together with the verify sense amplifier 4, thereby making it possible to read out the operation information at a high speed due to an increase in the number of sense amplifiers that simultaneously read out the information.

Upon completion of latching the read operation information into the operation information latch portion 6 (S13: Y), the control circuit 7 judges that the operation conditions related to the read operation has been latched in the operation information latch portion 6. Then, the control circuit 7 sets a status flag indicative of a ready state announcing that the read access operation from the non-redundant memory regions 1 and 2 is enabled (S14). Thereafter, the control circuit 7 outputs the ready signal through the status output portion 8 in response to the external read access request to the non-redundant memory regions 1 and 2. Simultaneously, the latched read operation information effects the voltage generator circuit 14 to supply the bias voltage in the read operation to the row decoders 18A and 18B, the column decoders 19A and 19B, and the memory regions of the respective banks 21A and 21B. Also, the latched read operation information effects the read sense amplifier 3 and the verify sense amplifier 4, and controls the sense amplifier that conducts the read access operation and the read of the operation information with the initializing operation. In response to the read access request to the memory cell array regions 5A and 5B, a busy signal is outputted because the latch of the redundancy information is not completed. Also, in response to the rewrite access request, the busy signal is outputted with respect to the access request to all of the memory regions because the latch of the rewrite operation information is not completed.

The non-redundant memory regions 1 and 2 from which the ready signal is outputted in response to the read access request allow the read access operation. Since a bank different from another bank in which the operation information is stored allows the parallel operation, read of the boot program can be conducted in parallel with read of the operation information. The initializing operation from the start of the initializing operation until the read access operation to the non-redundant memory regions 1 and 2 can be conducted is categorized as Step I.

Subsequent to the latch of the read operation information, the redundancy information related to the redundant relief is read out (S15). More specifically, the control circuit 7 operates the address register 12, and the address signal indicative of a position of an address space in which the redundancy information is stored is outputted from the address register 12. Also, the control circuit 7 activates the verify sense amplifier 4 and reads out the read information.

The verify sense amplifier 4 can be used for reading out the redundancy information. This is because the read access operation of the boot program is executed on the basis of the read operation information that has been latched in the previous step, and the read sense amplifier 3 may be occupied. The boot program is read out to the output terminal D0 through the read data line RDB and the output buffer 17 by means of the read sense amplifier 3, and the redundancy information is read out by means of the verify sense amplifier 4 and latched in the operation information latch portion 6. The initializing operation of the non-volatile memory device and the start operation with read of the boot program from the non-volatile memory device can be conducted in parallel. Also, in the case where a set of read sense amplifiers 3 and a set of verify sense amplifiers 4 are disposed for each of the banks, if a bank where the read access operation of the boot program is executed and another bank where the read of the operation information of the redundancy information is executed are different from each other, it is possible that the read sense amplifier 3, the verify sense amplifier 4 or both of those amplifiers are used for reading out the operation information of the redundancy information while the read sense amplifier 3 is used for reading out the boot program.

Upon completion of latching the redundancy information into the operation information latch portion 6 (S16:Y), the control circuit 7 judges that the address information of the memory cell to be subjected to the redundant relief has been latched in the operation information latch portion 6. The coincidence detector portion 13 refers to the redundancy information that is outputted from the operation information latch portion 6 with the results that the address signal that is outputted from the address register 12 is an address to be subjected to the redundant relief or not, and the redundant relief is conducted in the memory cell array regions 5A and 5B of the respective banks 21A and 21B. The control circuit 7 sets a status flag indicative of a ready state that announces that the read access operation from the memory cell array regions 5A and 5B is enabled in addition to the non-redundant memory regions 1 and 2 (S17), and then outputs a ready signal through the status output portion 8 according to the external read access request to the memory cell array regions 5A and 5B. Because the latch of the rewrite operation information is not completed with respect to the rewrite access request, in response to an external rewrite access request, a busy signal is outputted with respect to all of the memory regions.

The read access operation to the non-volatile memory regions 1 and 2 has already been enabled in Step I, and in addition to this state, the read access operation to the memory cell array regions 5A and 5B becomes enabled. Since the parallel operation can be conducted in a bank different from another bank in which the operation information is stored, the boot program that continues from Step I can be read out in parallel with the read of the operation information. In addition, subsequently to completion of reading out the boot program, or instead of reading out the boot program, the application program can be read out. The initializing operation from the start of reading out the redundancy information in the initializing operation until the read access operation to the memory cell array regions 5A and 5B can be conducted is categorized as Step II.

Subsequent to the latch of the redundancy information, the rewrite operation information for setting the rewrite conditions is read out (S18). More specifically, the control circuit 7 operates the address register 12 and an address signal indicative of a position of an address space in which the rewrite operation information is stored is outputted from the address register 12. Also, the control circuit 7 activates the verify sense amplifier 4 and reads out the rewrite operation information.

During reading of the rewrite operation information, the verify sense amplifier 4 can be used. This is because the read access operation of the boot program or the application program is executed with respect to the non-redundant memory regions 1 and 2 and the memory cell array regions 5A and 5B on the basis of the read operation information and the redundancy information that have been latched in the previous stage, and the read sense amplifier 3 may be utilized. The boot program or the application program is read out in the output terminal D0 through the read data line RDB and the output buffer 17 by means of the read sense amplifier 3. Also, the rewrite operation information is read out by means of the verify sense amplifier 4 and then latched in the operation information latch portion 6. The initializing operation of the non-volatile memory device and the start operation of the system or the application with reading of the program from the non-volatile memory device can be conducted in parallel. Also, in the case where a set of read sense amplifiers 3 and a set of verify sense amplifiers 4 are disposed for each of the banks, if a bank where the read access operation of the boot program is executed and another bank where the read of the operation information of the rewrite operation information is executed are different from each other, it is possible that the read sense amplifier 3, the verify sense amplifier 4 or both of those amplifiers are used for reading out the operation information of the rewrite operation information while the read sense amplifier 3 is used for reading out the boot program.

Upon completion of latching the rewrite operation information into the operation information latch portion 6 (S16:Y), the control circuit 7 judges that the operation conditions related to the rewrite operation has been latched in the operation information latch portion 6. The rewrite operation information that is outputted from the operation information latch portion 6 is inputted to the voltage generator circuit 14, and a bias voltage in the rewrite operation is applied to the row decoders 18A and 18B, the column decoders 19A and 19B, and the memory regions of the respective banks 21A and 21B. The control circuit 7 sets a status flag indicative of a ready state that announces that the rewrite access operation into the memory cell array regions 5A and 5B is enabled in addition to the non-redundant memory regions 1 and 2 (S20), and then outputs a ready signal through the status output portion 8 according to the external rewrite access request.

The read access operation has been already enabled by Step II and, in addition to this state, the rewrite operation is enabled. As a result, the initializing operation is completed. The initializing operation from the start of reading out the rewrite operation information until the rewrite access operation is enabled is categorized as Step III.

In the description of the flowchart shown in FIG. 2, in the case where the memory cell array regions 5A and 5B and where the redundant relief is conducted and the non-redundant memory regions 1 and 2 where no redundant relief is conducted exist together, preference is given to the latch of the read operation information and preference is given to the read access operation to the non-redundant memory regions 1 and 2 as the initializing operation, thereby enabling the initializing operation. The non-redundant memory regions 1 and 2 may not exist depending on the non-volatile memory device. That is, this is a case of the structure in which the boot sector has redundancy within the large sector. In this case, it is preferable to give preference to the latch of the redundancy information together with the read operation information. At a stage where the operation information has been completely latched, the read access operation can be conducted on all of the memory regions.

Figure 3:
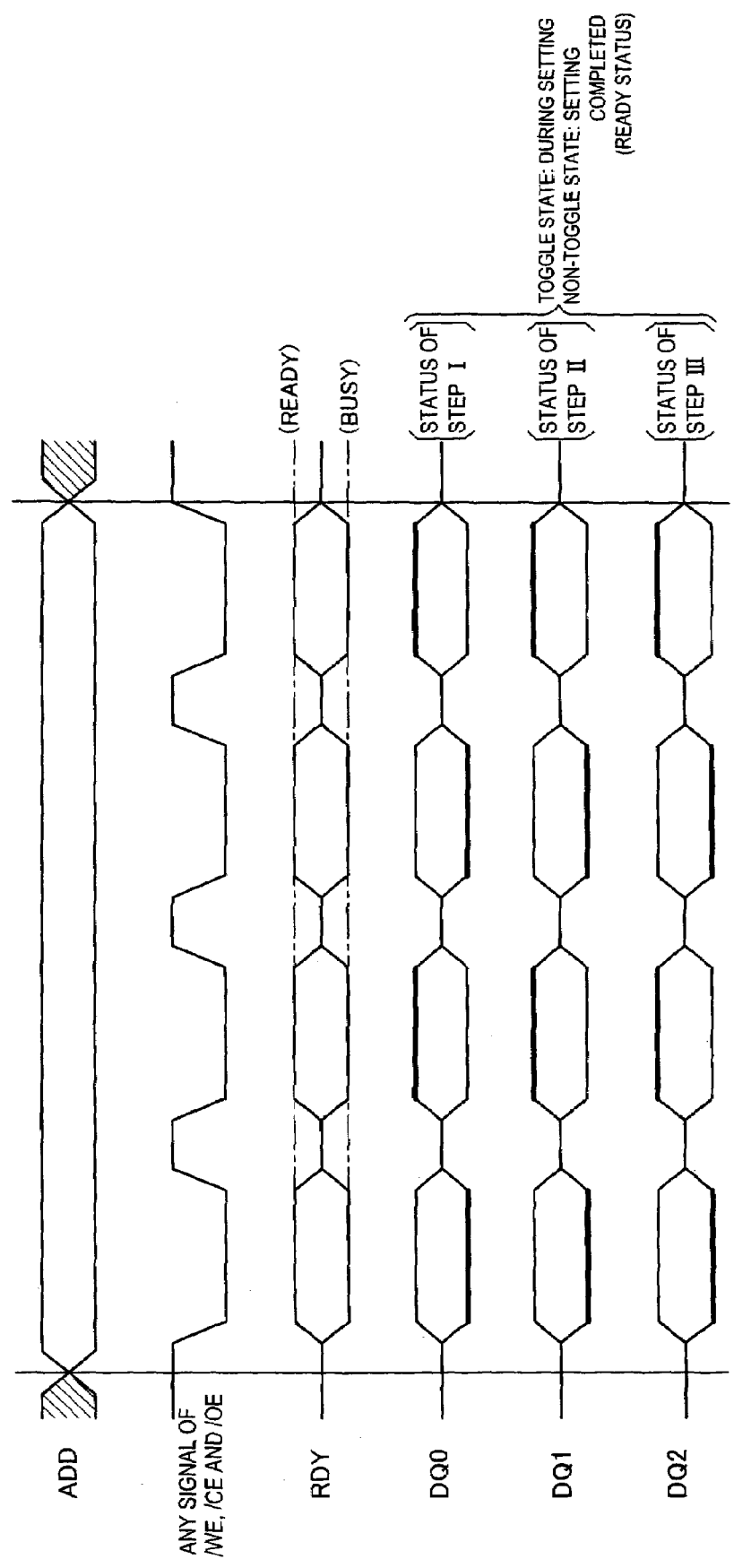
FIG. 3 is a waveform diagram exemplifying a status signal during the initializing operation in accordance with the first embodiment.

FIG. 3 shows an output example of the status signal to an external access request. A ready signal RDY is outputted from a dedicated status terminal when at least one signal of a /WE signal, a /CE signal, and an /OE signal becomes low level and activated, and the address signal is also inputted as the external access request. That is, in the case where the access operation is enabled according to the initializing stages of Steps I to III, the ready signal RDY transits to the high level, and the ready state is announced. In the case where the access operation is impossible, the ready signal transits to the low level, and the busy state is announced.

In FIG. 3, there is shown a structure wherein whether the inputted access request is enabled or not is announced according to the respective initializing operation stages of Steps I to III using the data terminal DQx (x=0 to 2) instead of the ready signal RDY or together with the read signal RDY. A case in which a toggle signal is outputted as the data signal DQx with the repetitive operation of /WE signal, /CE signal, or /OE signal is announced as the busy state. That is, in the case of the initializing operation state of Step I, the toggle signal (in this case, 4 cycles) is outputted as the data signal DQ0. Likewise, in the case of the initializing operation state of Step II, the toggle signal (in this case, 4 cycles) is outputted as a data signal DQ1, and in the case of the initializing operation state, the toggle signal (in this case, 4 cycles) is outputted as a data signal DQ2. Also, in the case where the operation information of the respective steps has been completely latched, the effective data signal DQ0 is outputted when the latch operation in Step I is completed. Likewise, when the latch operation in Step II is completed, the effective data signal DQ1 is outputted, and when the latch operation in Step III is completed, the effective data signal DQ2 is outputted. Also, the stage being performed in the initializing operation can be identified by the combination of the data signal DQ0, the data signal DQ1 and the data signal DQ2 instead of the toggle signal (in this case, 4 cycles).

In the case where the access request is made externally, the status signal indicative of whether the access operation inputted according to the inputted address signal being enabled or not, is announced as the ready signal RDY. As a result, when the logic level of the ready signal RDY is confirmed, it can be judged whether the individual access requests are enabled or not. In addition, the data signals DQ0 to DQ2 can be used as the status signals indicative of the respective stages of the initializing operation instead of the ready signal RDY or together with the ready signal RDY. With the above structure, when the access request is given from the external, the stage of the initializing operation can be identified and the access kind and address which allow the access request can be decided according to the identified stage.

Figure 4:
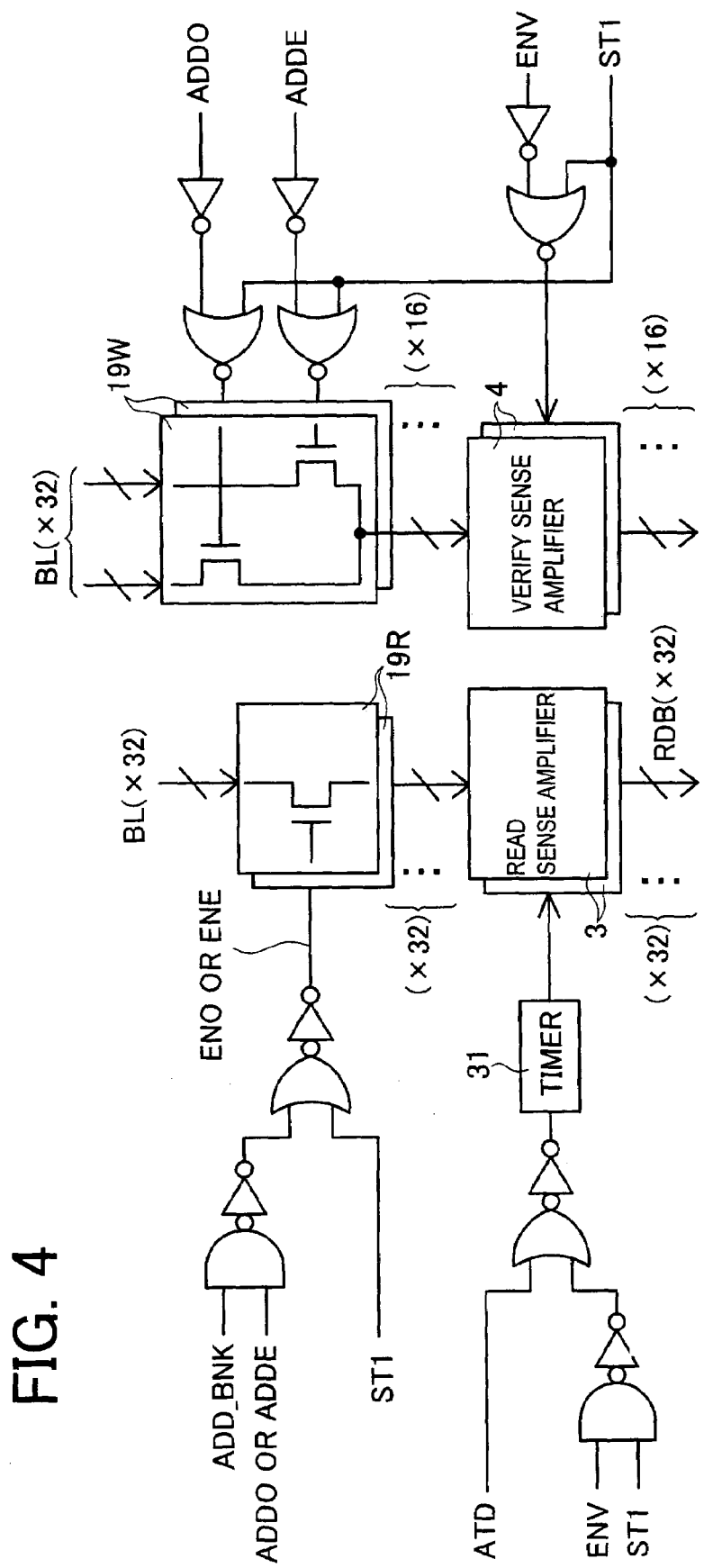
FIG. 4 is a circuit block diagram that controls a sense amplifier which reads out information in accordance with the first embodiment.

FIG. 4 is a circuit structure that appropriately selects the sense amplifiers according to the step of the initializing operation when reading out the operation information from the memory region in the initializing operation shown in FIG. 2 to effectively read out the operation information necessary for the initializing operation, and the boot program or the application program. In FIG. 4, as one example, bit lines BL of 32 bit width are provided, the information is read out in the read data line RDB by 32 bit width units, and the rewrite operation is conducted by 16 bit width units. In this example, the read data line RDB in the read operation is 32 bit width which is twice as large as 16 bit width in the rewrite operation because the continuous read operation is conducted at a high speed, that is, because a burst operation that alternately reads out the bit lines BL with 16 bit width is utilized.

Each of the bit lines BL is connected to the read sense amplifier 3 through a read column decoder 19R, and any, one of the respective two bit lines BL is selected and connected to the verify sense amplifier 4 through each of verify column decoders 19W. The read sense amplifier 3 is connected to the output buffer 17 and the operation information latch portion 6 through the read data line RDB. The verify sense amplifier 4 is connected to the operation information latch portion 6 (FIG. 1).

In each of the read column decoders 19R, a bank address ADD_BNK, and any one of an odd low-order address ADDO or an even low-order address ADDE are inputted to a NAND gate, and also inverted by an inverter gate. Then, the bank address ADD_BNK, and the low-order address ADDO or ADDE is input to the logic operation AND. The AND operation result and a step I state signal ST1 indicating that the initializing operation is in Step I are input to the logic operation OR through a NOR gate and an inverter gate, thereby outputting a decode signal ENO or ENE. The decode signal ENO according to the odd low-order address ADDO are inputted to the half of the read column decoders 19R. The decode signal ENE according to the even low-order address ADDE RE inputted to the remaining half of the read column decoders 19R.

In the state where the regular access operation is enabled or the state subsequent to Step II in the initializing state, the step I state signal ST1 is low level, and decoding is performed by the AND operation result of the bank address ADD_BNK, and the low-order address ADDO or the ADDE. That is, when the odd low-order address ADDO is inputted to a selected bank, the decode signal becomes high level, and the half of the read column decoders 19R are selected, correspondingly. When the even low-order address ADDE is inputted to the selected bank, the decode signal ENE becomes high level, and the remaining half of the read column decoders 19R is selected, correspondingly. In Step I of the initializing operation, the step I state signal ST1 becomes high level. In this state, both of the decode signals ENO and the ENE become high level regardless of the even and odd of the low-order address and the 32 bit lines BL outputted from the read column decoders 19R are connected to the read sense amplifiers 3.

In the read sense amplifier 3, in the case where both of the verify signal ENV that instructs the verification of the rewrite state at the time of rewrite and the Step I state signal STI are high level, or in the case where the address transition signal ATD is high level, the timer circuit 31 starts. The timer circuit 31 activates the read sense amplifier 3 at a given timing. The timing of activation is conducted according to the output of the address transition signal ATD in a state subsequent to Step II in a state where the regular access operation is enabled or in the initializing operation state. The address transition signal ATD is a signal generated according to the input of an address, and the read sense amplifier 3 is activated according to an input of the address to read out the information.

In this example, the control circuit 7 (FIG. 1) that controls the read of the operation information in the initializing operation includes an automatic rewrite control circuit that controls the procedure of the rewrite operation as will be described later. The read of the operation information is conducted by using the procedure of verifying of the rewrite state in the automatic write control circuit. The verify signal ENV is outputted from the automatic rewrite control circuit. In the case where the verify signal ENV is outputted and the operation information is read out at the time of the initializing operation, the Step I state signal ST1 becomes high level and if in the state of Step I, the read sense amplifier 3 is activated, and the operation information is read out of the read sense amplifier 3.

In the verify column decoder 19W, the Step I state signal ST1 and an inversion signal resulting from inverting any address signal of the odd low-order address signal ADDO and the even low-order address signal ADDE by the inverter gate are inputted to the NOR gate and then decoded.

In a state where the regular access operation is enabled, or in a state after Step II in the initializing operation state, the Step I state signal ST1 is low level. When any one of the odd low-order address signal ADDO and the even low-order address signal ADDE is selected, and becomes high level, any one of two transistors that constitute the verify column decoder 19W is selected, and the half of the bit lines BL having the 32 bit width is connected to the verify sense amplifier 4. In the state of Step I in the initializing operation, the Step I state signal ST1 becomes high level. In this state, both of those two transistors that constitute the verify column decoder 19W are unselected regardless of the status of the verify column decoder 19W.

The Step I status signals ST1 and verify signal ENV indicating identification (Verify) of overwrite state in overwrite operation are input into a NAND gate, and verify sense amplifier 4 is controlled by an inverted signal through an inverter gate. The verify sense amplifier 4 is activated under the control according to the AND operation result of the Step I state signal ST1 and the verify signal ENV. In the state of Step I in the initializing operation, the Step I state signal ST1 become high level.

In the state after Step II in a state where the regular access operation is enabled or in the initial state, the Step I state signal ST1 is low level. In this case, the verify sense amplifier 4 is activated according to the verify signal ENV of the high level. In addition to a case of verifying the rewrite state according to the rewrite access operation, in the case where the boot program or application program is read out of the read sense amplifier 3 after Step II of the initializing operation, the operation information can be read out of the verify sense amplifier 4. In the state of Step I in the initializing operation, the Step I state signal ST1 is high level. In this case, the verify sense amplifier 4 is inactive regardless of the verify signal ENV.

In Step I of the initializing operation, when the read operation information for setting the read condition is read out, since various program such as the boot program or data has not yet been read out, the read sense amplifier 3 that perform high speed operation is used, thereby making it possible to increase the number of sense amplifiers that read out the program or data at the same time, and the operation information is read out at a high speed. In Step II which is the initializing operation after the read conditions are set, the operation information is read out by the verify sense amplifier 4, thereby making it possible to use the read sense amplifier 3 for reading the boot program and to conduct the initializing operation and the read operation of the boot program or the like in parallel. It is possible to read out the read operation information at a high speed in addition to the parallel read of the operation information and the boot program and it is possible to further reduce a period of time until external access operation such as the boot program can start.

Also, in the case where a set of read sense amplifiers 3 and a set of verify sense amplifiers 4 are disposed for each of banks, if a bank where the read access operation of the boot program is executed is different from a bank where the read of the operation information of the redundancy information is executed, even after Step II which is the initializing operation after the read conditions are set, any one of the read sense amplifier 3 and the verify sense amplifier 4 can be used for reading out the operation information while the read sense amplifier 3 is used for the read access operation of the boot program as with Step I. In this case, the operation information is read out while being controlled by the automatic rewrite control circuit included in the control circuit 7. However, it is possible to read out the operation information by means of the read sense amplifier 3, to read out the operation information by means of the verify sense amplifier 4 or to read out the operation information by means of both of the sense amplifiers according to the control by the automatic rewrite control circuit.

Figure 5:
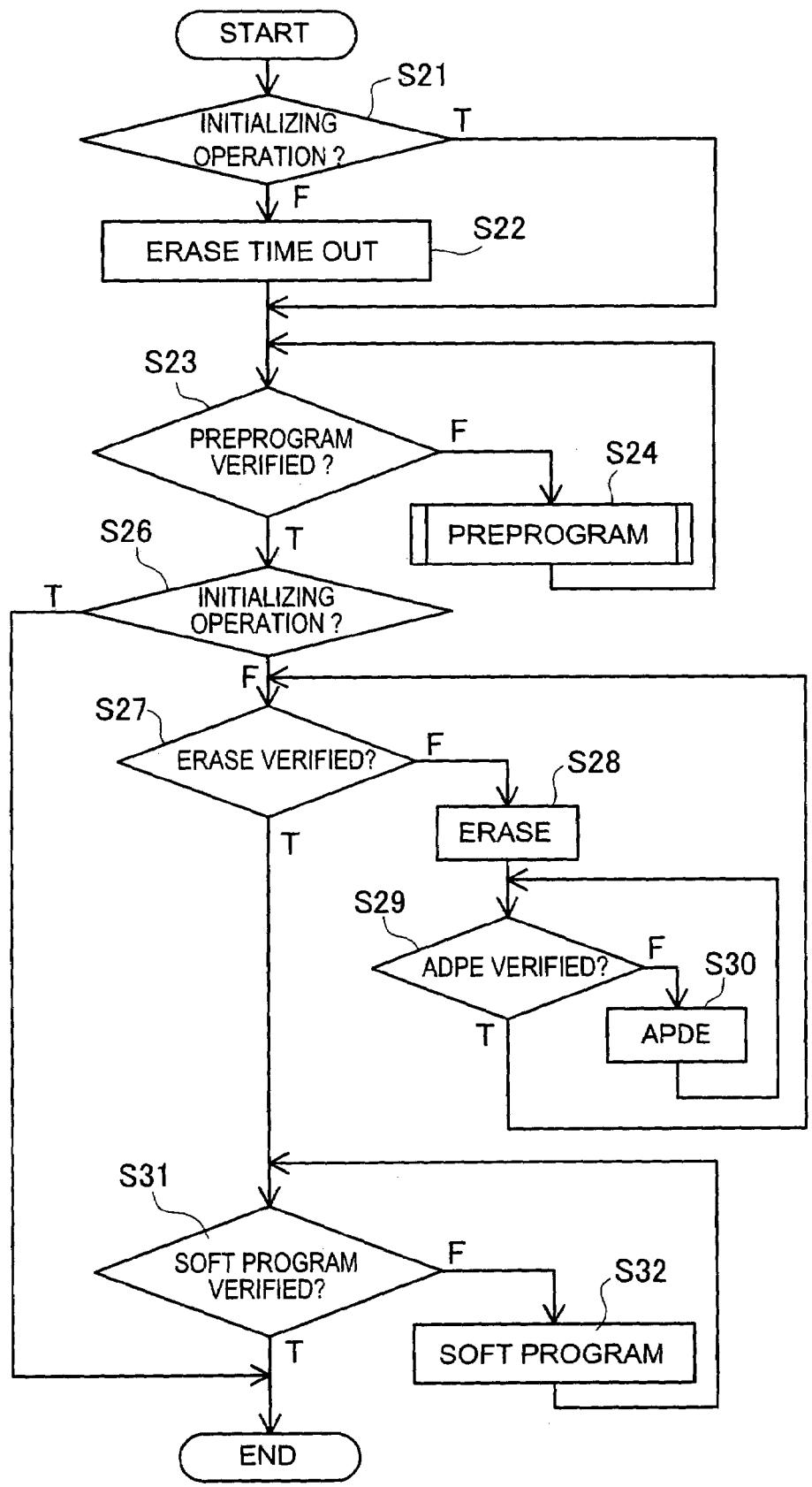
FIG. 5 is a flowchart showing a rewrite control operation including the initializing operation in accordance with a second embodiment of the present invention.

FIG. 5 is a flowchart showing operation controlled by an automatic rewrite control circuit (not shown) included in the control circuit 7 (FIG. 1) in accordance with a second embodiment of the present invention. FIG. 5 shows a processing flow of an erase operation during the rewrite access operation. When the automatic rewrite control circuit starts, it is judged whether the start is based on the initializing operation or not (S21). In the case where the start is based not on the initializing operation but regular rewrite access operation (S21: F), erase timeout is executed (S22). During the erase timeout, an address signal such as an address signal identifying a sector to be erased is inputted. In the case of the initializing operation, since it is unnecessary to execute the erase timeout, S22 is skipped (S21: T).

Subsequently, it is judged whether preprogram verify is necessary or not (S23). When it is judged that the processing routine of preprogram (S24) is not necessary (S23: T), it is determined whether the process is the initializing operation, or not (S26). If the process is the initializing operation (S26: T), the processing by means of the automatic rewrite control circuit is completed. In the case where the process is not the initializing operation (S26: F), the regular erase operation is conducted. The erase verification is conducted (S27), and if necessary (S27:F), the execution of erase operation (S28), APDE verify operation (S29) and APDE operation (S30) are repeated. Thereafter, soft program verification (S31) and soft program operation (S32) are further executed to complete the erase operation. The preprogram is to program only the non-volatile memory cell once it is in the erase state before erasing in order to avoid over-erase of the non-volatile memory cell. Also, the APDE and the soft program are directed to steps for improving the distribution width of the threshold characteristic of the non-volatile memory cell after erasing.

In the case where the memory cell of the erase state exists in the erase access operation or in the case where the process is the initializing operation (S23: F), the process is shifted to the processing routine (S24) of the preprogram by the preprogram verification (S23).

Figure 6:
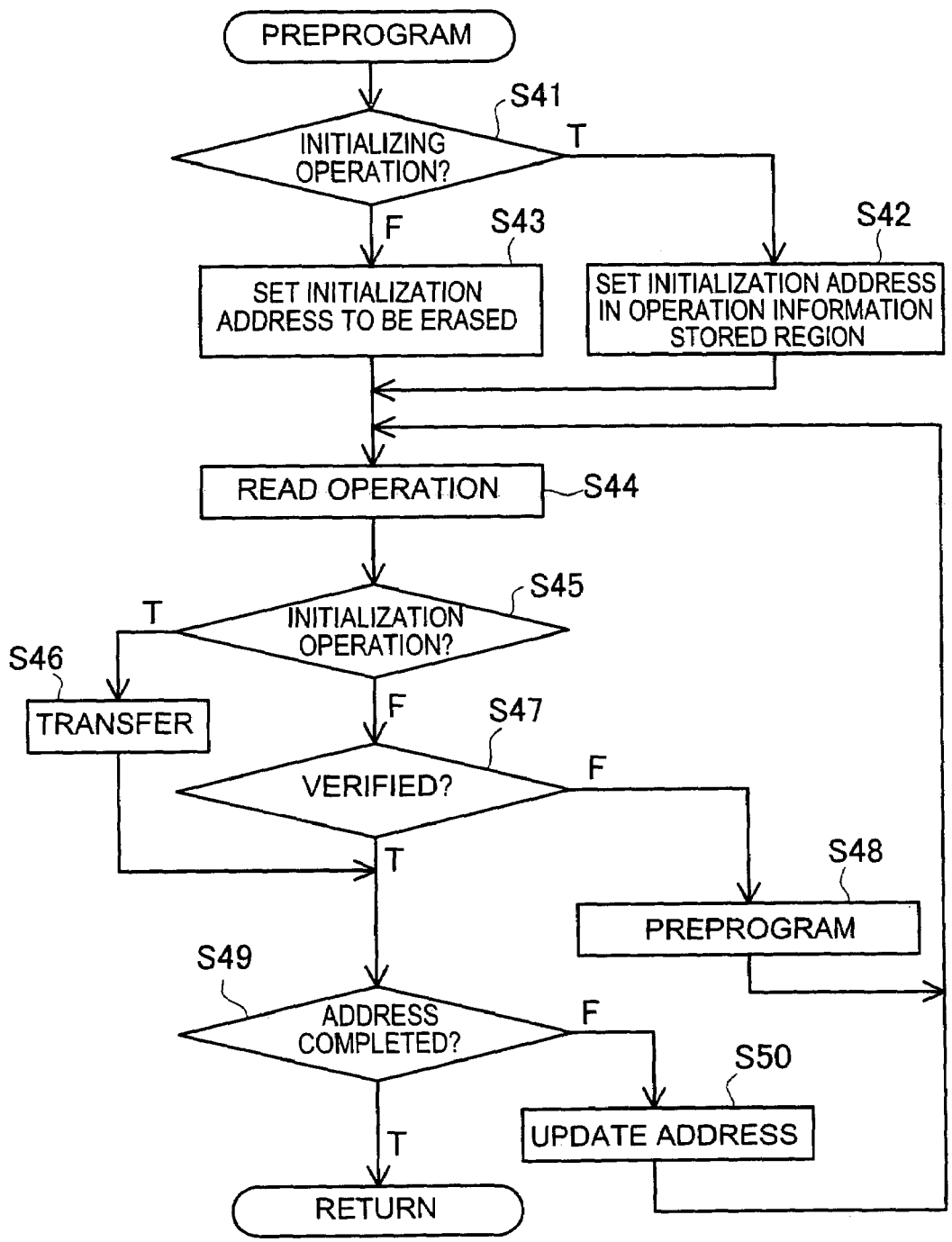
FIG. 6 is a flowchart showing preprogram processing of the flowchart shown in FIG. 5.

The contents of the processing routine of the preprogram (S24) is shown in FIG. 6. In the routine of the preprogram operation, it is first judged whether the process is the initializing operation, or not (S41). When the process is the initializing operation (S41: T), an initial address of a region in which the operation information is stored is set (S42), and when the process is not the initializing operation (S41: F), an initial address to be erased is set (S43). After that, the read operation is executed (S44). Thereafter, when the process is the initializing operation (S45: T), the read operation information is transferred to the operation information latch portion 6 (S46). Thereafter, it is determined whether the read information is information at a final address, or not (S49), and when the read information is not at the final address (S49: F), the address is updated (S50), and the process is returned to step S44. After the transfer operation (S46) is repeated from the read operation (S44), the preprogram routine is ended at a time when the read address is completed (S49: T).

When it is judged that the operation is not the initializing operation in S45 (S45: F), the verify operation is conducted (S47). When it is determined by the verify operation that the read information is not in the program state (S47: F), the preprogram operation is executed (S48), and the process is returned to S44. Then, the verify operation (S47) is again executed from the read operation (S44). When it is judged through the verify operation that the read operation is in the program state (S47: T), it is determined whether the read information is information at the final address, or not (S49). When the read information is not at the final address (49: F), the address is updated (S50), and the process is returned to the step S44. Then, the verify operation (S47) is conducted from the read operation (S44), and the preprogram routine is ended at a time when the read address is completed (S49: T).

As a result, in the preprogram routine (S24) of the automatic rewrite control circuit included in the control circuit 7, the operation information at the time of the initializing operation can be read out by using the read operation (S44) provided for verifying the preprogram state.

In this case, when the read operation (S44) is the regular verify operation, the verify sense amplifier 4 is used. However, the operation of reading out a large number of information at the same time is possible, and therefore a circuit structure using the read sense amplifier 3 instead of the verify sense amplifier 4 is shown in FIG. 7.

Figure 7:
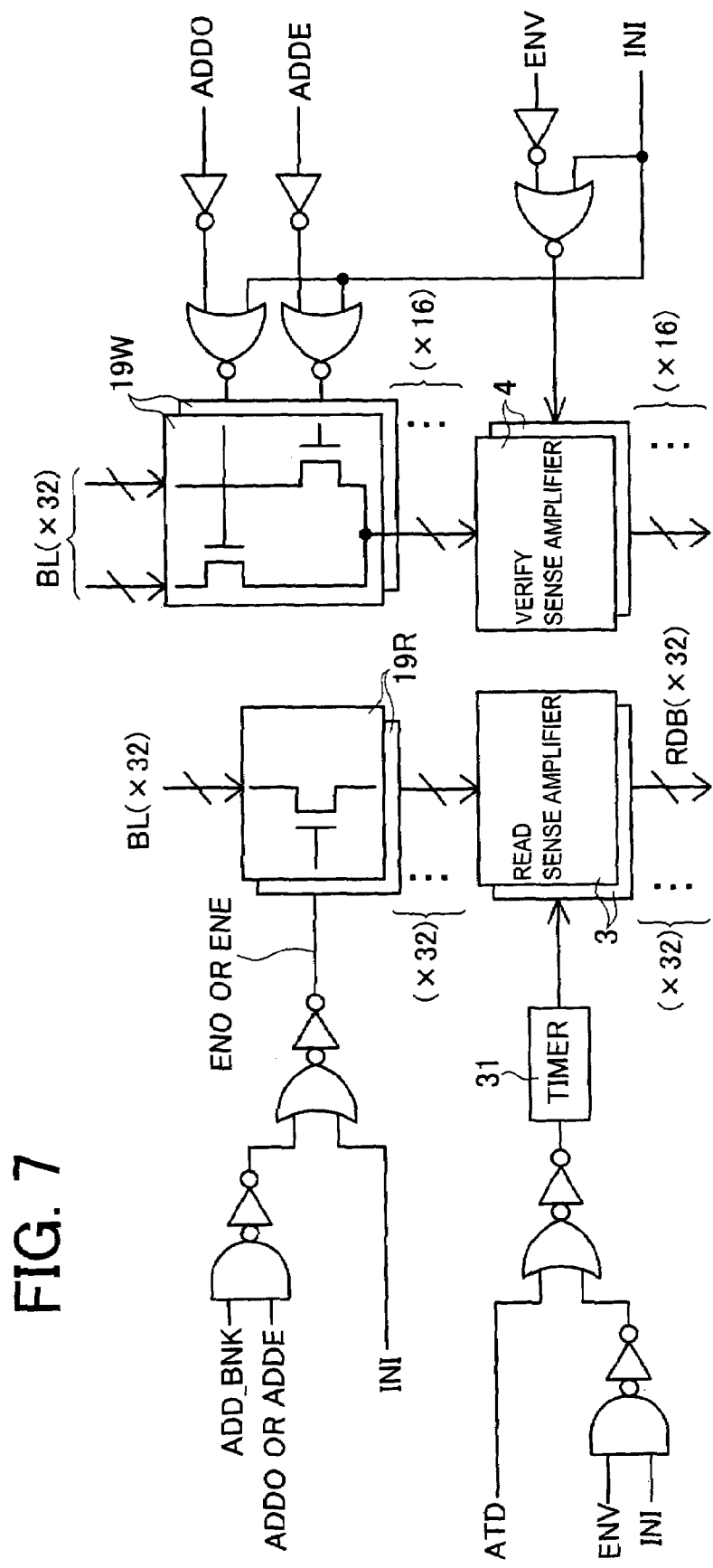
FIG. 7 is a circuit block diagram that controls a sense amplifier that reads out information in accordance with the second embodiment.

In FIG. 7, an initialization signal INI indicative of the initialization operation state is inputted instead of the Step I state signal ST1 in the circuit structure shown in FIG. 4. In this example, the initialization signal INI is a signal that is outputted by the power-on-reset circuit 11 according to power-on, or a signal that is generated according to that signal, or a signal that is generated according to a reset signal (not shown). The signal becomes high level at the time of the initializing operation, thereby unselecting the verify column decoder 19W, inactivating the verify sense amplifier 4, and selecting the read column decoder 19R to activate the read sense amplifier 3.

As a result, the read operation (S44) at the time of verification in the preprogram routine (S24) can be executed by using the read sense amplifier 3. In the rewrite access operation including the erase access operation, because a large current is required as compared with the read access operation, there is proposed that the bit width in the rewrite access operation is further reduced as compared with the bit width in the read access operation shown in FIG. 7. In the case where the read access operation enables the burst operation that enables high-speed continuous operation, it is possible to simultaneously activate a large number of read sense amplifiers 3 by the data width at the time of read access. Also, it is possible to read out a larger number of operation information than the rewrite access operation at the same time as using a part of the operation sequence in the automatic rewrite control circuit. It is possible to reduce the period of time from the start of the initializing operation to the start of the external access operation such as read of the boot program in order to reduce the initialization operation period of time.

In the circuit block diagram shown in FIG. 7, a case is exemplified in which, in the read of the operation information at the time of the initializing operation, the read sense amplifier 3 is used instead of the verify sense amplifier 4 to read out the operation information while using the read operation (S44) at the time of verification in the automatic rewrite control circuit included in the control circuit 7 in response to the initialization signal INI. However, the second embodiment is not limited to this example. In the circuit block diagram shown in FIG. 7, a low level signal is fixedly inputted instead of the initialization signal INI that is inputted to a logic circuit that controls the verify column decoder 19W and the verify sense amplifier 4. As a result, the operation information is read out according to the read operation (S44) at the time of verification in the rewrite state and can be read out by the verify sense amplifier 4 in addition to the read sense amplifier 3. The bit width that can be read out at the same time can be further widened.

In the second embodiment, the verification of the preprogram routine is used. However, the present invention is not limited to this example. For example, the verification within the erase routine may use the verification within the APDE routine or the verification within the soft program routine. In this case, because an ideal threshold value is different in each of the verifications, a reference cell that functions to only read out the operation information at the time of the initializing operation may be used as a reference threshold value to the verify sense amplifier 4.

Figure 8:
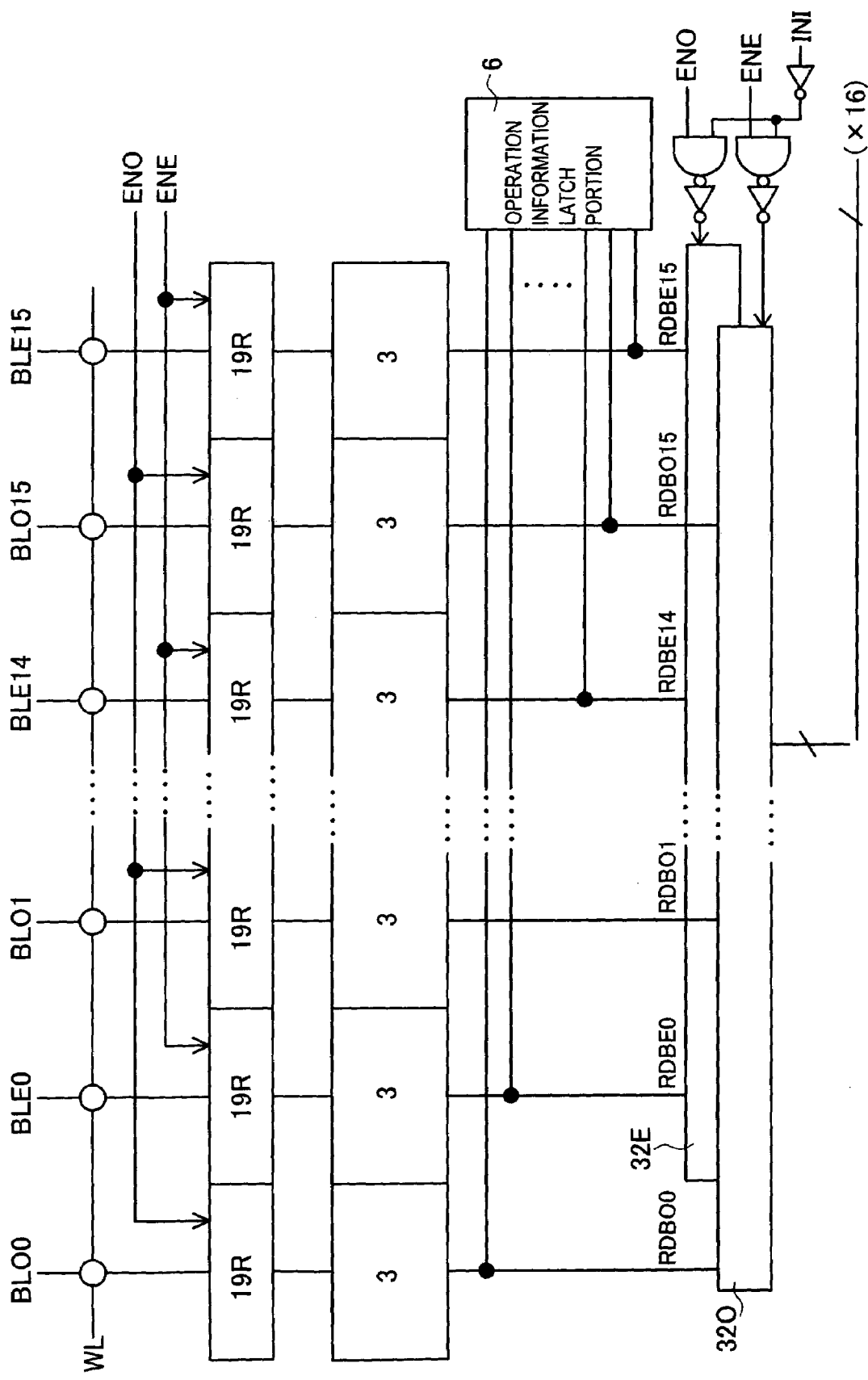
FIG. 8 is a circuit block diagram showing a circuit structure of a bit line and a read sense amplifier which enables burst read operation.

A description will also be given of a circuit structure having the burst read operation as the read access operation in which the bit width of the operation information which is read out at the same time in the initializing operation is expanded with reference to the circuit block diagram shown in FIG. 8 and the operation waveform diagram shown in FIG. 9.

In FIG. 8, each of bit lines BLO0 to BLO15 and BLE0 to BLE15 which are arranged in a memory cell array region has a read column decoder 19R and a read sense amplifier 3. The read column decoders 19R are selected according to the decode signals ENO and ENE at the odd positions and the even positions, and connected to the respective read sense amplifiers 3. The respective read sense amplifiers 3 are connected to selector circuits 32O and 32E through data lines RDBO0 to RDBO15 and RDBE0 to RDBE15 at each of the odd positions and the even positions. The selector circuits 32O and 32E are selected according to the AND operation result of the inversion signal of the initialization signal INI and the decode signal ENE, and the AND operation result of the inversion signal of the initialization signal INI and the decode signal ENO, and the data lines RDBO0 to RDBO15, or the data lines RDBE0 to RDBE15, are connected to the read data line RDB. Also, each of the data lines RDBO0 to RDBE15 and RDBE0 to RDBE15 are connected to the operation information latch portion 6.

In FIG. 1, the operation information latch portion 6 and the output buffer 17 are connected to each other from the read sense amplifier 3 through the read data line RDB. On the other hand, in FIG. 8, in order to realize the burst operation, the operation information latch portion 6 is connected to the output buffer 17 through the selector circuits 32O and 32E from the read sense amplifier 3.

Figure 9A:
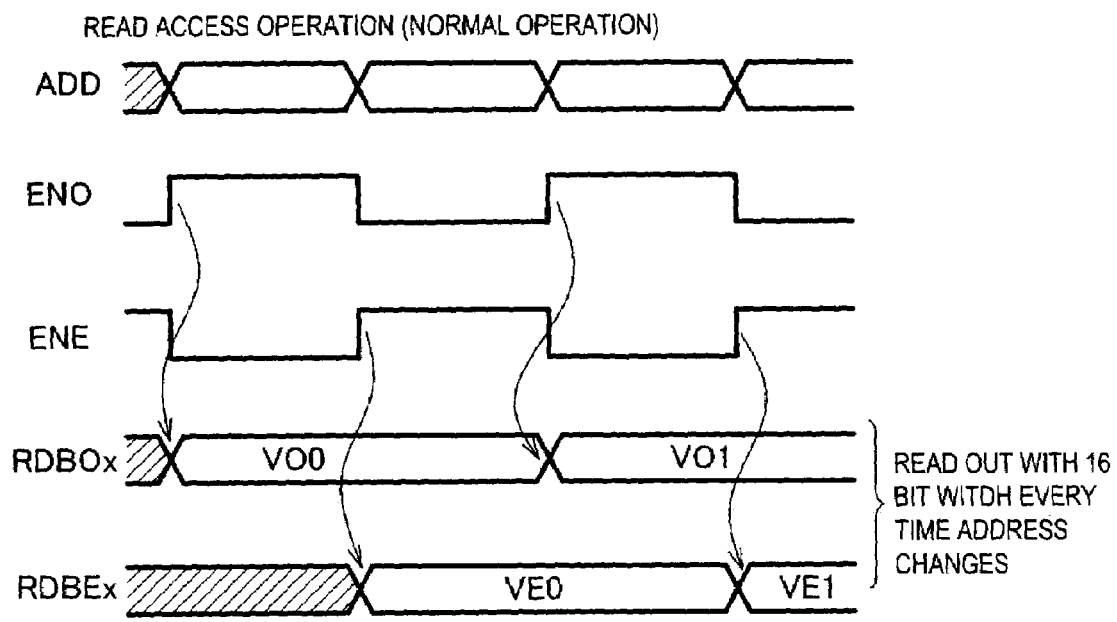
FIG. 9A is an operation waveform diagram at the time of conducting the burst read operation in the circuit structure shown in FIG. 8.

As shown in FIG. 9A, in the read access operation, the decode signals ENO and ENE are alternately activated by sequentially incrementing the address signal ADD and alternately switching over between the odd addresses and the even addresses. The read column decoder 19R at the odd position is selected according to the decode signal ENO, and the information that is read out by the read sense amplifier 3 at the odd position and outputted to the data line RDBOx (X=0 to 15) is updated. The read column decoder 19R at the even position is selected according to the decode signal ENE, and the information that is read out by the read sense amplifier 3 at the even position and outputted to the data line RDBEx (X=0 to 15) is updated. That is, the decode signals ENO and ENE are control signals that selectively activate the read sense amplifier 3.

In this situation, since the initialization signal INI is at a low level, the selector circuits 32O and 32E are controlled according to the decode signals EVE and EVO, and a data line that is not updated is connected to the read data RDB. That is, in the case where the data line RDBOx (x=0 to 15) is updated, the selector circuit 32E is selected according to the decode signal ENO, and the data line RDBEx (x=0 to 15) is connected to the read data line RDB. In the case where the data line RDBEx (x=0 to 15) is updated, the selector circuit 32O is selected according to the decode signal ENE, and then connected to the read data line RDB. As a result, the bit line of the odd address and the bit line of the even address are alternately switched over with respect to the bit lines BLO0 to BLO15 and BLE0 to BLE15 having the bit width of 32 bits, and the burst operation is conducted through the read data line RDB having the bit width of 16 bits.

Figure 9B:
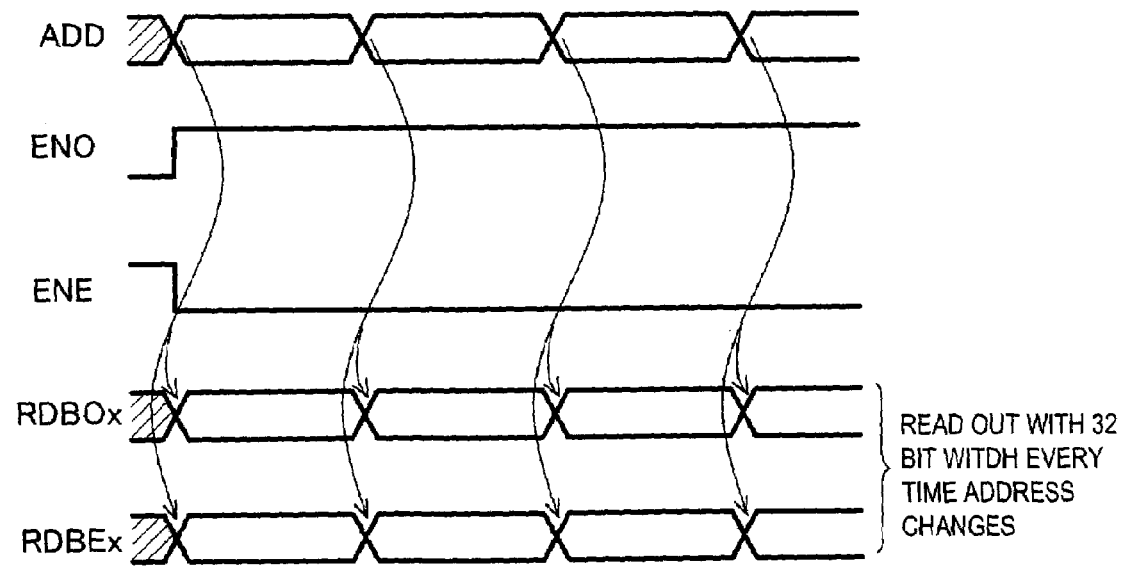
FIG. 9B is an operation waveform diagram at the time of conducting an initializing operation in the circuit structure shown in FIG. 8.

On the contrary, in the initializing operation, as shown in FIG. 9B, both of the decode signals ENO and ENE are activated (all selected) by sequentially incrementing the address signal ADD regardless of the odd or even of the address signal. All of the read column decoders 19R are selected regardless of the odd or even, and the read operation is conducted by all of the read sense amplifiers 3, and the information that is outputted to the data lines RDBOx and RDBEx (x=0 to 15) are updated every address cycle. In this example, because the initialization signal INI is activated to high level, both of the selector circuits 32O and 32E are held in an unselected state. The initialization signal INI is latched in the operation information latch portion 6 as the operation information without being outputted to the external through the output buffer. As a result, the operation information is read out with the bit width of 32 bits. That is, the read control of the operation information is conducted by the larger number of read sense amplifiers than the number of read sense amplifiers 3 that are activated in conducting the read access operation.

In this case, because the read sense amplifier 3 is disconnected from the read data line RDB, the load capacity is reduced and the cycle of the address increment can be shortened.

In the case where the operation information is read out under the control of the automatic rewrite control circuit, it is desirable that the control of an internal supply voltage that is generated internally is changed as follows. In general, in the non-volatile memory device, plural kinds of internal voltages are generated at the same time mainly for program, erase and verify. This is a high voltage positively stepped up or a high voltage negatively stepped down. For example, in the former, a step-up voltage 8 V is generated with respect to an external voltage 1.8 V at the time of program. Also, a step-up voltage 4 V is generated with respect to an external voltage 1.8 V at the time of reading out. In addition, in the latter, a negative step-up voltage −8 V is generated with respect to the external voltage 1.8 V. In order to generate the respective internal voltages, dedicated voltage step-up circuits are provided. These voltage step-up circuits have a charge pump that is made up of a large number of stages of capacitors. The respective voltages are regulated to a predetermined voltage value and then generated; therefore a long period of time is required until the respective voltages are regulated to the predetermined voltage. The generating period of time is lengthened more as a voltage difference between the external voltage and an intended internal voltage is increased. In the automatic rewrite control circuit, all kinds of internal voltages are set to have sufficient voltage values and, in order to sufficiently ensure the maximum voltage, a long period of time is set. More specifically, the long period of time is 1 ms or longer with respect to one read time of 10 ns, which is very long, and the long period of time is added every time the steps of the respective routines shown in FIGS. 5 and 6 are repeated.

At the time of reading out the operation information in the initializing operation, only one kind of internal voltage is generated which requires the read operation, and it is possible to reduce the long period of time that is set by the automatic rewrite control circuit. More specifically, at the time of read out, the internal voltage that is applied to the word lines may be about 4 V, and the number of stages of capacitors of the charge pump type is 2 to 3, or a dedicated step-up circuit having a reduced number of stages is used, thereby making it possible to reduce a period of time until reading out the boot program or the like.

As a result, in the case of reading the operation information during the initializing operation, the period of time until data latch of the operation information can be sped up, and the period of time until reading of a boot program and the like can be shortened by controlling the read start timing or the read cycle to be shorter than a regular set time.

Figure 10:
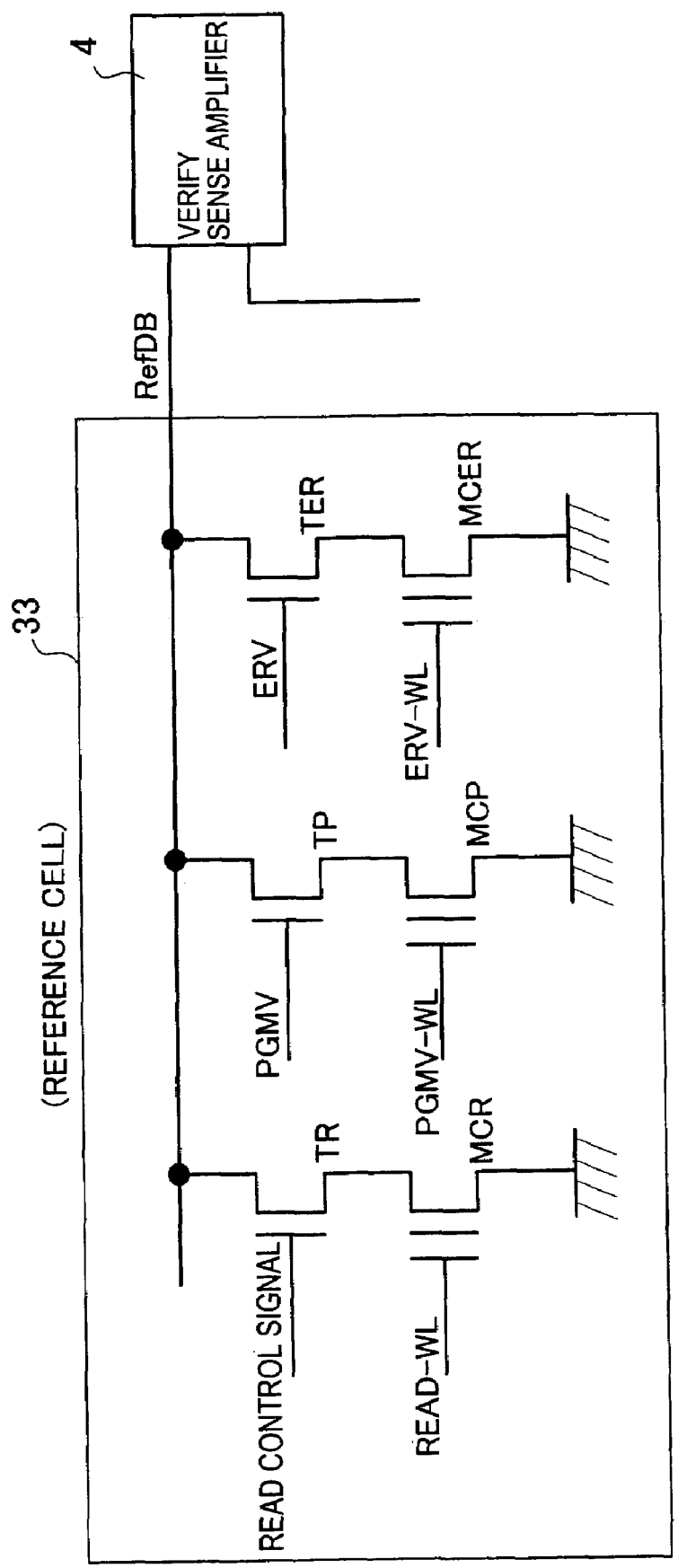
FIG. 10 is a circuit diagram showing a circuit structural example of a reference cell portion that is connected to a verify amplifier.
Figure 11:
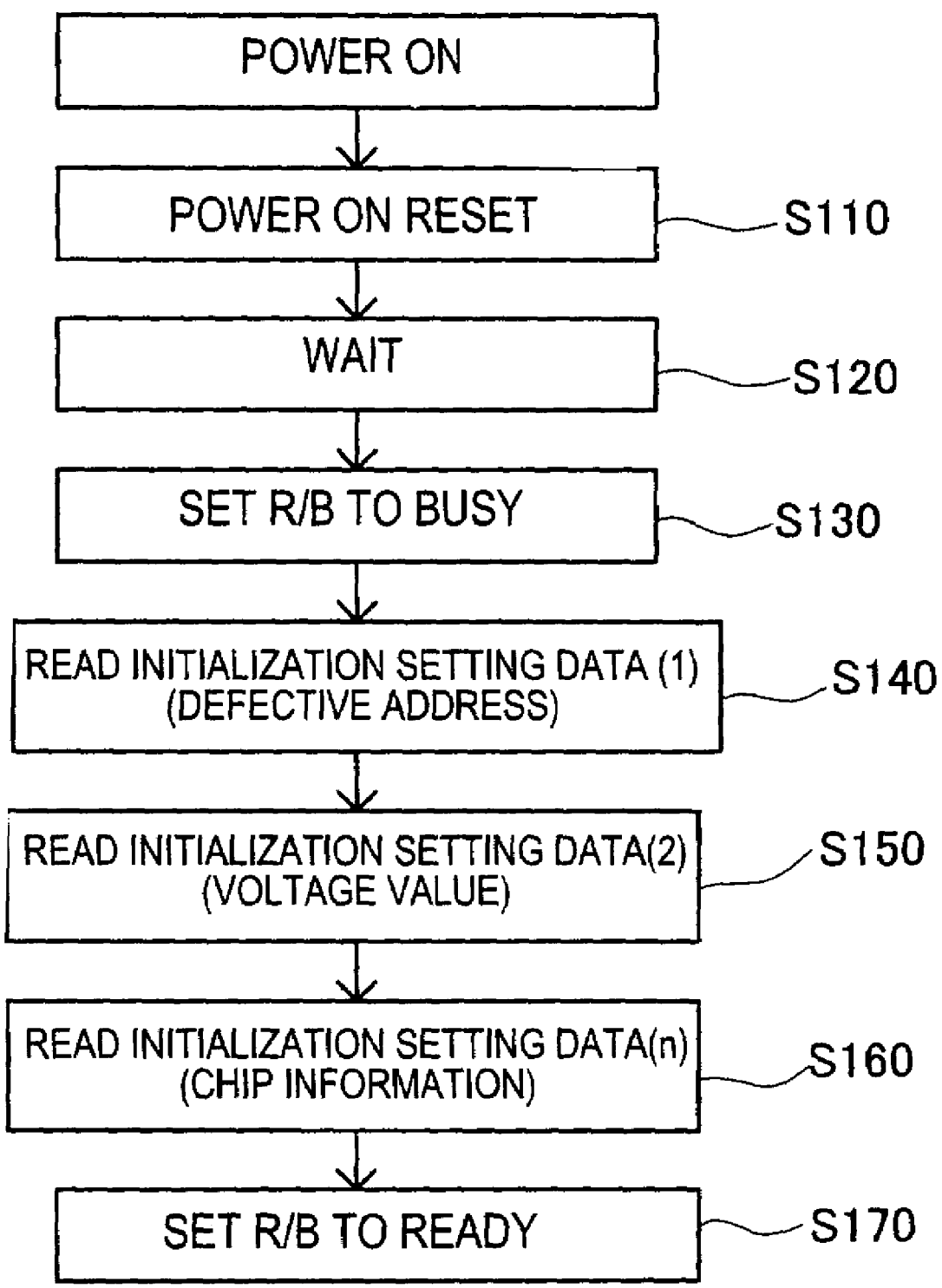
FIG. 11 is a flowchart showing the initializing operation in accordance with Patent Document 1.

In the first and second embodiments, when the level of the information that is read out of the verify sense amplifier 4 is confirmed, a reference cell for read out is required. FIG. 10 shows a structural example of the reference cell portion.

The reference cell portion 33 is equipped with a memory cell MCER for erase verification which is required at the time of verification and a memory cell MCP for program verification. The respective gate terminals are connected with an erase word line ERV-WL, and a program word line PGMV-WL, and the respective drain terminals are connected to the reference data line RefDB through select transistors TER and TP controlled by the erase verify signal ERV and the program verify signal PGMV. The source terminal is connected to the ground potential. The reference data line RefDB is connected to the verify sense amplifier 4 to read out the information.

In the reference cell 33, in addition to the above components, the read memory cell MCR has a gate terminal connected to the read word line READ-WL, and a source terminal connected to the ground potential, and a drain terminal connected to a reference data line RefDB through a select transistor TR that is controlled by the read control signal. In this example, the read control signal is a control signal for reading out the operation information at the time of the initializing operation.

With the above structure, the verify sense amplifier 4 can read out on the basis of the corresponding reference cells that are connected to the reference data lines RefDB according to the selection of the erase word line ERV-WL, the program word line PGMV-WL and the read word line READ-WL as well as the erase verify signal ERV, the program verify signal PGMV and the read control signal (READ CONTROL SIGNAL) in the respective cases of the read operation in addition to the program operation.

In this case, the current drive performance of the read memory cell MCR can be set to be smaller than the current drive performance of the reference cell which is used in the regular read access operation. The number of memory cells in which the operation information is stored can be limited according to the amount of operation information to be stored. The number of memory cells which are connected per bit line can be reduced less than the regular bit lines. As a result, a column leak current per bit line which is attributable to the memory cell in which the operation information is stored can be reduced, according to which a current amount that is allowed to flow by means of the reference cell can be limited.

In accordance with the present invention, there is proposed that, instead of the provision of the read memory cell MCR, the current drive performance in the transistors of the read sense amplifier 3 or the verify sense amplifier 4 which reads out the operation information can be changed. That is, at the time of reading out the operation information, the current drive performance of the transistor that is connected with the reference cell is increased while using the program verify memory cell MCP, or the current drive performance of the transistor that is connected with the reference cell is increased while using the erase verify memory cell MCER, thereby making it possible to take the characteristics required in conducting the read operation to the sense amplifier.

When the bit lines are provided for each of the memory cells in which the operation information is stored, another unselected memory cell does not exist, and a problem on the column leak current in the read operation of the operation information can be eliminated.

Also, in the memory cells that are connected to the same bit line, the same operation information is stored, thereby making it possible to suppress the problem on the column leak current in the read operation of the operation information.

As is apparent from the above description, according to the present invention, it is possible to read out and set the read operation information in preference, and conduct the read access operation at an initial stage of the initializing operation. After the read access operation is enabled, it is possible to conduct the regular data read operation including the boot program or application program in parallel with the read setting of the operation information.

Also, this embodiment was described with reference to an example of high-speed read of the boot sector. Similarly, the present invention can be applied to the high-speed read of a small sector. That is, when the setting information of the redundant address is not applied to the small sector, the small sector can also be included in Step I of FIG. 2, and the application program can be read out at a high speed as with the boot program, thereby improving the performance of the system.

Also, in the case of providing a plurality of banks 21A and 21B that enable the access operation independently, when the operation information is stored in one bank while the boot program or application program is stored in another bank, the read of the operation information and the read of the program can be conducted in parallel after the read operation information is set.

In addition, the respective operation information exemplified in FIG. 1 may be arranged in an area independent from the respective banks, for example, within a peripheral circuit where a logic circuit that drives the memory cell array exists.

Also, the verify sense amplifier 4 that is different from the read sense amplifier 3 used in the regular read access operation can be used in the read of the operation information at the time of the initializing operation, thus allowing read to be conducted in parallel. In this case, at a stage of reading out the read operation information from the operation information, since the regular read access operation is not conducted, the operation information can be read out by using the read sense amplifier 3. In general, since the read sense amplifier 3 can conduct the high speed read operation as compared with the verify sense amplifier 4, the high-speed read of the operation information can be performed.

When the operation information is read out at the time of the initializing operation, the operation information can be read out by using the read sense amplifier 3 used in the read access operation instead of the verify sense amplifier 4 while using the read operation at the time of verification in the control of the automatic rewrite control circuit. A larger number of sense amplifiers 3 than the number of verify sense amplifiers 4 are used, thereby enabling high speed read.

The period of time from the start of the initializing operation till the read of the boot program or application program is thus shortened, thereby making it possible to reduce the time necessary before a system starts in the system into which the non-volatile memory device is incorporated.

The present invention is not limited to the above embodiments, and various improvements or modifications can be conducted within a scope of the subject matter of the present invention.

For example, in the above embodiments, there was described a case in which the operation information is read out by using the verify function of the erase access operation in the automatic rewrite control circuit. However, the present invention is not limited to the above embodiments, and for example, other read operation such as the program function can be used.

What is claimed is:

1. An initialization control method in a non-volatile memory device wherein operation information is read out from a memory cell array of the non-volatile memory device during an initialization operation thereof, the operation information including first operation information consisting of read-operation information and second operation information consisting of operation information other than the read-operation information, the initialization control method comprising the steps of:
    preferentially reading all of the first operation information; and
    thereafter executing in parallel the step of reading the second operation information and the step of permitting read access operation to the memory cell array.

2. The initialization control method of the non-volatile memory device according to claim 1, wherein the memory cell array includes a boot sector and/or a small sector, and wherein the step of executing in parallel the step of reading the second operation information and permitting the read access operation comprises the step of executing in parallel the step of reading the second operation information and the step of permitting read access operation to the boot sector and/or the small sector.

3. An initialization control method in a non-volatile memory device wherein operation information is read out from a memory cell array of the non-volatile memory device during an initialization operation thereof, the operation information including first operation information consisting of read-operation information, redundant first operation information consisting of redundancy information of the read-operation information, and second operation information consisting of operation information other than the first operation information and the redundant first operation information, the initialization control method comprising the steps of:
    preferentially reading all of the first operation information;
    reading the redundant first operation information; and
    thereafter executing in parallel the step of reading the second operation information and the step of permitting read access operation to the memory cell array.

4. The initialization control method of the non-volatile memory device according to claim 3, wherein the memory cell array includes a small sector, and wherein the step of executing in parallel the step of reading the second operation information and permitting the read access operation comprises the step of executing in parallel the step of reading the second operation information and the step of permitting read access operation to the small sector.

5. An initialization control method in a non-volatile memory device wherein operation information is read out from a memory cell array of the non-volatile memory device during an initialization operation thereof, the operation information including first operation information consisting of read-operation information and second operation information consisting of operation information other than the read-operation information, the initialization control method comprising the steps of:
preferentially reading all of the first operation information;
thereafter executing in parallel the steps of reading the second operation information and permitting read access operations to a non-redundant memory region separate from a redundant structure, wherein the step of permitting the read access operation comprises the steps of:
determining whether or not an address to be inputted concurrently with an external access request is in an accessible memory region; and
informing whether or not the read access operation is permissible in response to the result of the determining step.

6. An initialization control method in a non-volatile memory device wherein operation information is read out from a memory cell array of the non-volatile memory device during an initialization operation thereof, the operation information including first operation information consisting of read-operation information and second operation information consisting of operation information other than the read-operation information, the non-volatile memory device comprising a memory cell array and a verify amplifier, the verify amplifier verifying a rewrite state of a memory cell in the memory cell array during a rewrite access operation, the initialization control method comprising the step of:
preferentially reading all of the first operation information by the verify amplifier prior to reading out any of the second operation information.

7. The initialization control method of the non-volatile memory device in accordance with claim 6 wherein the non-volatile memory device further comprises a read amplifier for reading information from the memory cell array during a read access operation, the step of preferentially reading all of the first operation information comprising the step of reading all of the first operation information by the read amplifier and the verify amplifier, and wherein the initialization control method further comprises the step of reading the second operation information by the verify amplifier after reading the first operation information by the read amplifier and the verify amplifier.

8. A non-volatile memory device with a memory cell array in which operation information to be set during an initialization operation is stored, the non-volatile memory device comprising:
an auto-rewrite control circuit for controlling a write access operation;
a read amplifier for reading information from the memory cell array during a read access operation; and
a verify amplifier for verifying a rewrite state during a rewrite access operation, the verify amplifier including a read reference cell for providing a read-purpose reference level during reading the operation information,
wherein the auto-rewrite control circuit conducts read control of the operation information during the initialization operation and activates the read amplifier and the verify amplifier concurrently therewith.

9. A non-volatile memory device according to claim 8, wherein the read control of the operation information is such that a read staff timing or a read cycle is shorter than a verification staff timing or a verification cycle, respectively, during a rewrite access operation.

10. A non-volatile memory device according to claim 9, wherein shortening of the read start timing or the read cycle in comparison with the verification start timing or the verification cycle is done by controlling a generation time of an internal voltage.

11. A non-volatile memory device according to claim 8, wherein the number of the read amplifier activated concurrently by the auto-rewrite control circuit is larger than the number of the read amplifier activated concurrently with the read access operation.

12. A non-volatile memory device according to claim 8, wherein memory cells in which the operation information is stored are connected to the verify amplifiers via individual bit lines of each of the memory cells.

* * * * *